(12) United States Patent
Chang et al.

(10) Patent No.: US 11,908,838 B2
(45) Date of Patent: Feb. 20, 2024

(54) THREE-DIMENSIONAL DEVICE STRUCTURE INCLUDING EMBEDDED INTEGRATED PASSIVE DEVICE AND METHODS OF MAKING THE SAME

(71) Applicant: Taiwan Semiconductor Manufacturing Company Limited, Hsinchu (TW)

(72) Inventors: Jen-Yuan Chang, Hsinchu (TW); Chien-Chang Lee, Miaoli County (TW); Chia-Ping Lai, Hsinchu (TW); Tzu-Chung Tsai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 128 days.

(21) Appl. No.: 17/446,038

(22) Filed: Aug. 26, 2021

(65) Prior Publication Data

US 2023/0066372 A1 Mar. 2, 2023

(51) Int. Cl.
*H01L 49/02* (2006.01)
*H01L 25/065* (2023.01)
(Continued)

(52) U.S. Cl.
CPC .......... *H01L 25/0657* (2013.01); *H01L 21/56* (2013.01); *H01L 25/50* (2013.01); *H01L 28/60* (2013.01); *H01L 23/3121* (2013.01); *H01L 23/3157* (2013.01); *H01L 24/08* (2013.01); *H01L 24/32* (2013.01); *H01L 2224/08145* (2013.01); *H01L 2224/32145* (2013.01); *H01L 2225/06524* (2013.01); *H01L 2225/06548* (2013.01); *H01L 2225/06568* (2013.01)

(58) Field of Classification Search
CPC .......... H01L 21/56; H01L 25/50; H01L 28/60
See application file for complete search history.

(56) References Cited

U.S. PATENT DOCUMENTS

| 11,532,529 B2* | 12/2022 | Yu | H01L 24/94 |
| 11,646,281 B2* | 5/2023 | Yu | H01L 24/03 |
| | | | 257/678 |

(Continued)

FOREIGN PATENT DOCUMENTS

| TW | 201117349 A | 5/2011 |
| TW | 201405766 A | 2/2014 |

(Continued)

OTHER PUBLICATIONS

Taiwanese Patent and Trademark Office, Application No. 111114335 Office Action, dated Feb. 14, 2023, 9 pages.

*Primary Examiner* — Thao P Le
(74) *Attorney, Agent, or Firm* — The Marbury Law Group, PLLC

(57) ABSTRACT

A three-dimensional device structure includes a first die including a first semiconductor substrate, a second die disposed on the first die and including a second semiconductor substrate, a dielectric encapsulation (DE) layer disposed on the first die and surrounding the second die, a redistribution layer structure disposed on the second die and the DE layer, and an integrated passive device (IPD) embedded in the DE layer and electrically connected to the first die and the redistribution layer structure.

20 Claims, 14 Drawing Sheets

(51) Int. Cl.
*H01L 25/00* (2006.01)
*H01L 21/56* (2006.01)
*H01L 23/00* (2006.01)
*H01L 23/31* (2006.01)

(56) References Cited

U.S. PATENT DOCUMENTS

| | | | |
|---|---|---|---|
| 2023/0061861 A1* | 3/2023 | Chang | H01L 24/32 |
| 2023/0062027 A1* | 3/2023 | Chang | H01L 21/76898 |
| 2023/0066372 A1* | 3/2023 | Chang | H01L 25/0657 |
| 2023/0089263 A1* | 3/2023 | Lin | H01L 21/568 |
| 2023/0123427 A1* | 4/2023 | Yu | H01L 23/3114 |
| | | | 438/109 |

FOREIGN PATENT DOCUMENTS

| | | | |
|---|---|---|---|
| TW | 201630088 A | 8/2016 |
| TW | 201735323 A | 10/2017 |
| TW | 201826481 A | 7/2018 |
| TW | 201839941 A | 11/2018 |
| TW | 201923984 A | 6/2019 |
| TW | 202034474 A | 9/2020 |
| TW | 202040769 A | 11/2020 |

* cited by examiner

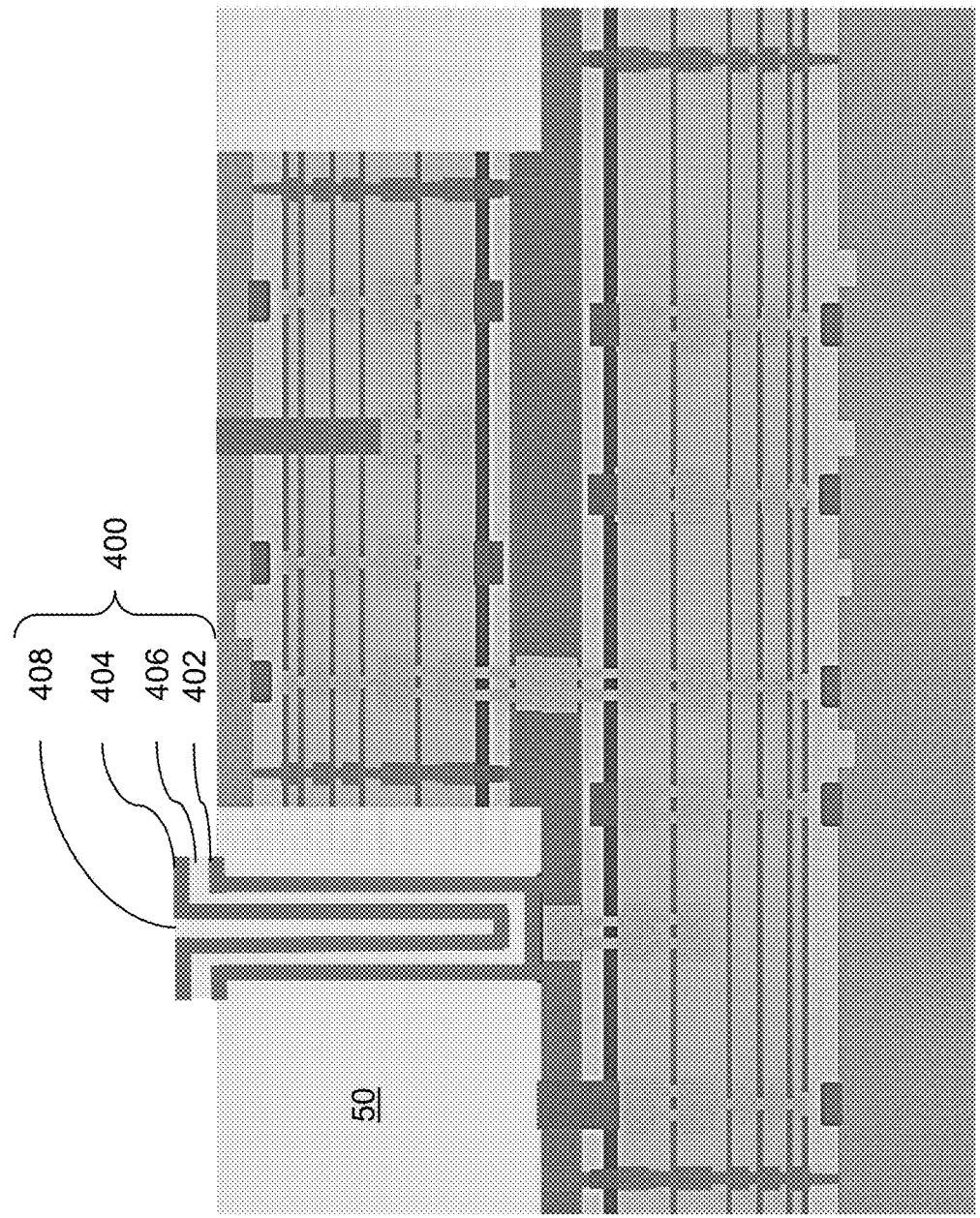

THREE-DIMENSIONAL DEVICE STRUCTURE INCLUDING EMBEDDED INTEGRATED PASSIVE DEVICE AND METHODS OF MAKING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4I are cross-sectional views showing the method of FIG. 3.

DETAILED DESCRIPTION

Figure 1A:
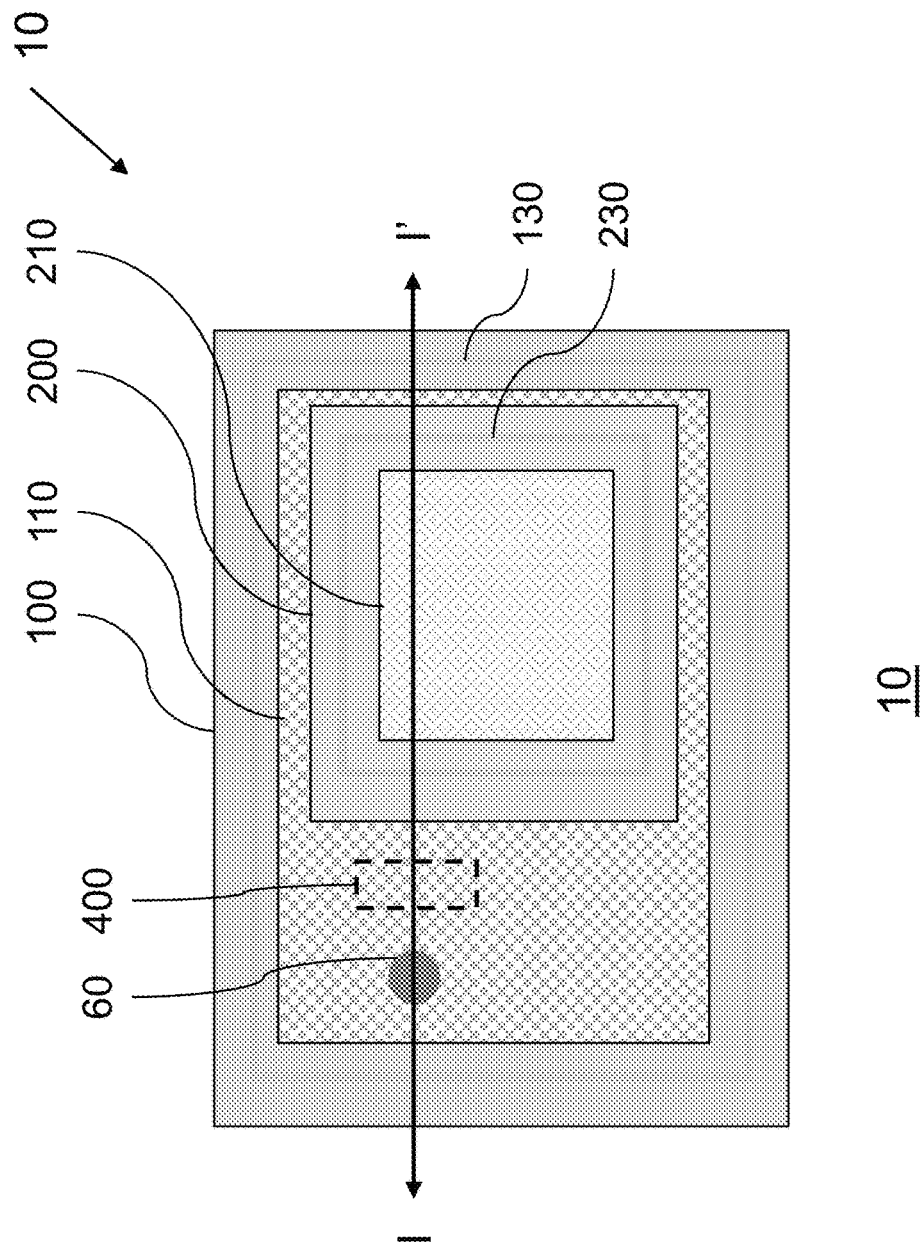
FIG. 1A is a simplified top view of a three-dimensional device structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to three-dimensional device structures that include one or more deep trench capacitors (DTC) integrated within a device package structure, to provide additional surface space for other surface-mounted components.

A PCB may include various surface-mounted electrical components that are arranged in a two-dimensional format, and electrically connected by conductive lines inside of the PCB. For example, integrated circuit chips may be arranged on the PCB and integrated passive devices (IPDs), such as capacitors, resistors, inductors, transformers, contact pads, etc., may be surface-mounted between the chips. As PCBs have become smaller, the surface area available for mounting electrical components has also been reduced, which makes component mounting increasingly difficult.

Accordingly, there is a need for packaging structures that allow for the relocation of electrical components, such as capacitors and/or other integrated passive components, from surface areas of a PCB to other areas, such as within dielectric layers of semiconductor dies, in order to free up surface areas for other components.

Figure 1B:
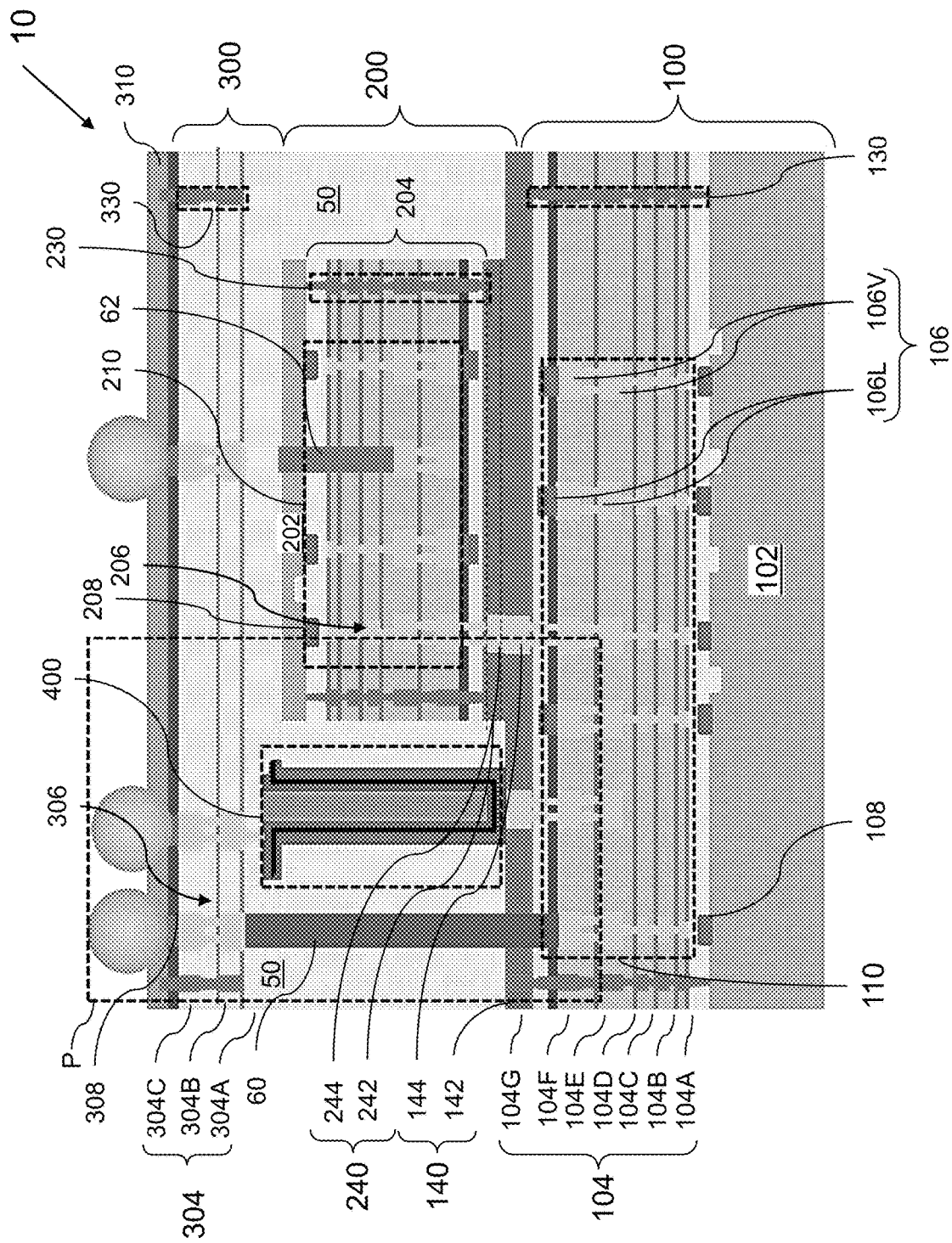
FIG. 1B is a cross-sectional view taken along line I-I' of FIG. 1A.
Figure 1C:
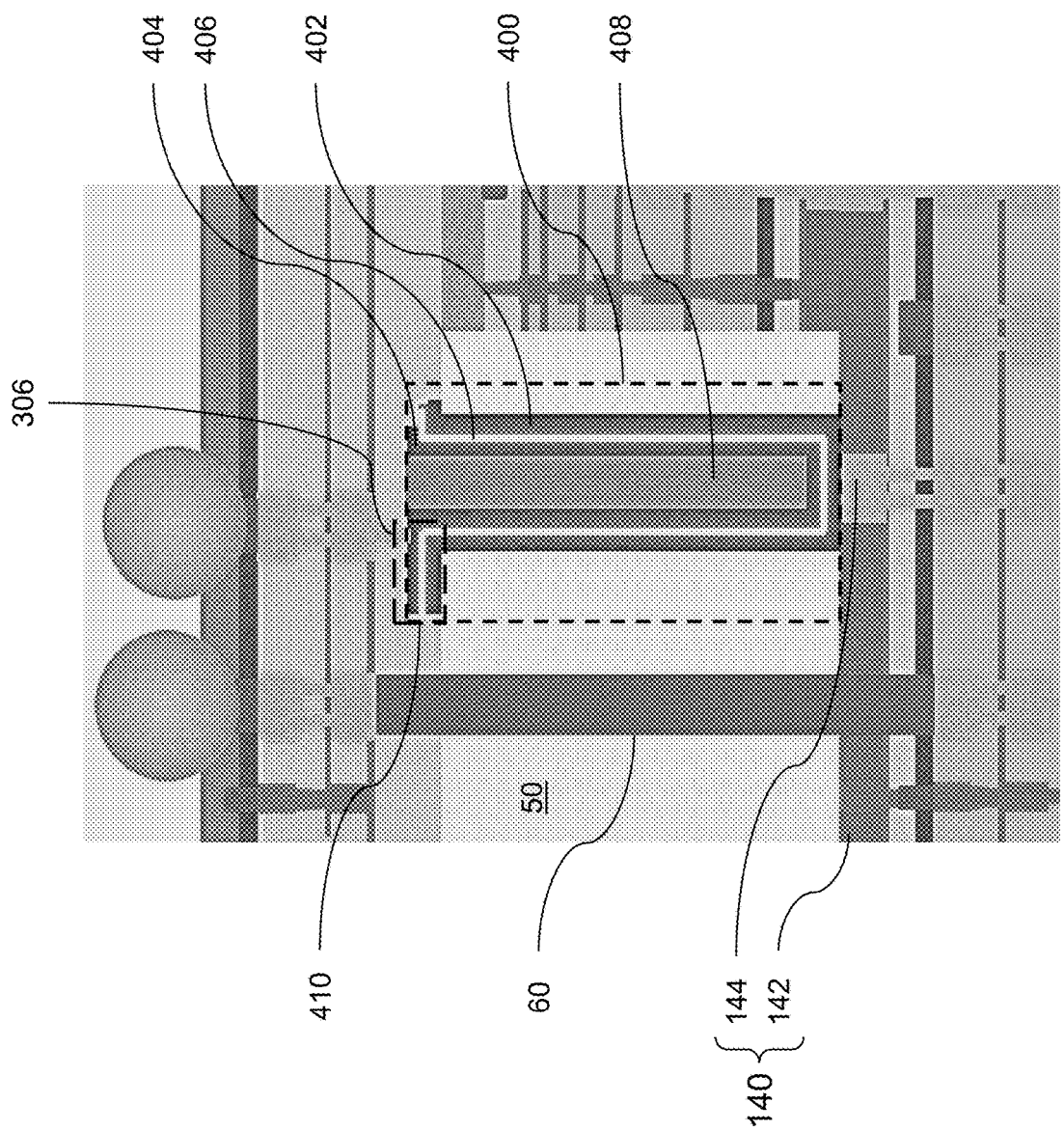
FIG. 1C is an enlarged view of a portion P of FIG. 1B.

FIG. 1A is a simplified top view of a three-dimensional device structure 10, according to various embodiments of the present disclosure. FIG. 1B is a cross-sectional view taken along line I-I' of FIG. 1A and that intersects a through dielectric via (TDV) structure 60 and a deep trench capacitor (DTC) 400 structure. FIG. 1C is an enlarged view of a portion P of FIG. 1B. Referring to FIGS. 1A-1C, the three-dimensional device structure 10 includes a first semiconductor die 100 and a second semiconductor die 200 disposed thereon.

The first die 100 may be, for example, an application-specific integrated circuit (ASIC) chip, an analog chip, a sensor chip, a wireless and radio frequency chip, a voltage regulator chip or a memory chip. In some embodiments, the first die 100 may be an active component or a passive component. In some embodiments, the first die 100 includes a first semiconductor substrate 102, a first dielectric structure 104, a first interconnect structure 110 embedded within the first dielectric structure 104, a first seal ring 130, and a first bonding structure 140.

In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, the first semiconductor substrate 102 includes isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer includes a gate structure, source/drain regions, spacers, and the like.

The first dielectric structure 104 may be disposed on a front side of the first semiconductor substrate 102. In some embodiments, the first dielectric structure 104 includes silicon oxide, silicon oxynitride, silicon nitride, a low dielectric constant (low-k) material, or a combination thereof. The first dielectric structure 104 may be a single layer or a multiple-layer dielectric structure. For example, as shown in FIG. 1B, the first dielectric structure 104 may include multiple dielectric layers, such as a substrate planarization layer 104A, inter-layer dielectric (ILD) layers 104B-104F, and an interconnect planarization layer 104G. However, while FIG. 1B illustrates seven dielectric layers, the various embodiments of the present disclosure are not limited to any particular number of layers, more or fewer layers may be used.

The first dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A first interconnect structure 110 may be formed in the first dielectric structure 104. The first interconnect structure 110 may include first metal features 106 disposed in the first dielectric structure 104. The first metal features 106 may be any of a variety of vias (106V) and metal lines (106L). The first metal features 106 be formed of any suitable electrically conductive material, such as tungsten (W), copper (Cu), a copper alloy, aluminum (Al), an aluminum alloy, combinations thereof, or the like. In some embodiments, barrier layers (not shown) may be disposed between the first metal features 106 and the dielectric layers of first dielectric structure 104, to prevent the material of the first metal features 106 from migrating to the first semiconductor substrate 102. The barrier layer may include Ta, TaN, Ti, TiN, CoW, or combinations thereof, for example. Other suitable barrier layer materials are within the contemplated scope of disclosure.

The first metal features 106 may include electrically conductive lines 106L and via structure 106V. The first via structures 106V may operate to electrically connect conductive lines 106L disposed in adjacent dielectric layers 104B-104F. The first metal features 106 may be electrically connected to first pads 108 disposed on the first semiconductor substrate 102, such that the first interconnect structure 110 may electrically connect semiconductor devices formed on the first semiconductor substrate 102 to various pads and nodes.

The first seal ring 130 may extend around the periphery of the first die 100. For example, the first seal ring 130 may be disposed in the first dielectric structure 104 and may laterally surround the interconnect structure 110. The first seal ring 130 may be configured to protect the interconnect structure 110 from contaminant diffusion and/or physical damage during device processing, such as plasma etching and/or deposition processes.

The first seal ring 130 may include copper at an atomic percentage greater than 80%, such as greater than 90% and/or greater than 95% although greater or lesser percentages may be used. The first seal ring 130 may include conductive lines and via structures that may be connected to each other, and may be formed simultaneously with the conductive lines 106L and via structures 106V of the first metal features 106 of the interconnect structure 110. The first seal ring 130 may be electrically isolated from the first metal features 106.

In some embodiments, the first metal features 106 and/or the first seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the first metal features 106 and/or the first seal ring 130 may be may be formed by an electroplating process.

For example, the Damascene processes may include patterning the first dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the first dielectric structure 104.

In particular, the patterning, metal deposition, and planarizing processes may be performed for each of the dielectric layers 104A-104G, in order to form the interconnect structure 110 and/or the first seal ring 130. For example, dielectric layer 104A may be deposited and patterned to form openings. A deposition process may then be performed to fill the openings in the dielectric layer 104A. A planarization process may then be performed to remove the overburden and form metal features 106 in the dielectric layer 104A. These process steps may be repeated to form the dielectric layers 104B-104F and the corresponding metal features 106, and thereby complete the first interconnect structure 110 and/or first seal ring 130.

The first die 100 may include a first bonding structure 140 disposed over the first dielectric structure 104. The first bonding structure 140 may include a first bonding layer 142 and one or more first bonding features 144. The first bonding layer 142 may be formed by depositing a dielectric material, such as silicon oxide, silicon nitride, a polymer, or a combination thereof, using any suitable deposition process. The first bonding features 144 may be disposed in the first bonding layer 142. The first bonding features 144 may be electrically conductive features formed of the same materials as the first metal features 106. For example, the first bonding features 144 may include tungsten (W), copper (Cu), a copper alloy, aluminum (Al), an aluminum alloy, or a combination thereof. Other suitable bonding structure materials are within the contemplated scope of disclosure. The first bonding features 144 may include bonding pads and/or via structures, in some embodiments.

The first bonding features 144 may be formed in the first bonding layer 142 by a dual-Damascene processes, or by one or more single-Damascene process, as described above. In alternative embodiments, the first bonding features 144 may be formed by an electroplating process.

The second die 200 may be disposed over and bonded to the first die 100. The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type of dies or different types of dies. In some embodiments, the second die 200 may be an active component or a passive component. In some embodiments, the second die 200 is smaller than the first die 100.

In some embodiments, the second die 200 is similar to the first die 100. For example, the second die 200 may include a second semiconductor substrate 202, a second dielectric structure 204, a second interconnect structure 210 embedded within the second dielectric structure 204, a second seal ring 230, and a second bonding structure 240. Thus, the difference between the second die 200 and the first die 100 is discussed in details below.

The second dielectric structure 204 may be disposed over a first side (e.g., front side) of the second semiconductor substrate 202. The second dielectric structure 204 may have a single-layer or multi-layer structure. For example, as shown in FIG. 1B, the second dielectric structure 204 may include multiple dielectric layers, such as a substrate planarization layer 204A, inter-layer dielectric (ILD) layers 204B-204F, and an interconnect planarization layer 204G. However, while FIGS. 1B and 1C illustrates dielectric layers forming the second dielectric structure 204, the various embodiments of the present disclosure are not limited to any particular number of layers.

The second interconnect structure 210 may be formed in the second dielectric structure 204. Specifically, the second interconnect structure 210 may be overlapped with and electrically connected to an integrated circuit region of the second semiconductor substrate 202. In some embodiments, the second interconnect structure 210 includes second metal features 206. The second metal features 206 are disposed in the second dielectric structure 204 and may be electrically connected to second pads 208 disposed on the second semiconductor layer 202, such that the second interconnect structure 210 may electrically connect semiconductor devices formed on the second semiconductor layer 202.

The second bonding structure 240 may be similar to the first bonding structure 140. The second bonding structure 240 may be disposed over the first side (e.g., front side) of the second interconnect structure 210. Specifically, the second bonding structure 240 may overlap with the second interconnect structure 210. In some embodiments, the second bonding structure 240 includes at least one second bonding layer 242 and one or more second bonding features 244. The second bonding features 244 are disposed in the second bonding layer 242. In some embodiments, the second bonding features 244 may include bonding pads and/or via structures.

The second seal ring 230 may be similar to the first seal ring 130. For example, the second seal ring 230 may include copper at an atomic percentage greater than 80%, such as greater than 90% and/or greater than 95%, although greater or lesser percentages of copper may be used. The second seal ring 230 may be disposed over the first side (e.g., front side) of the second semiconductor substrate 202. Specifically, the second seal ring 230 may surround the second interconnect structure 210, may extend through the second dielectric structure 204, and may be electrically insulated from circuit elements of the second semiconductor substrate 202. In some embodiments, the second seal ring 230 may be formed during the formation of the second dielectric structure 204. The second seal ring 230 may be at substantially the same level as the second interconnect structure 210. Specifically, the top surface of the second seal ring 230 may be coplanar with the top surfaces of the uppermost second metal features 206 of the second interconnect structure 210.

In some embodiments, the size of the second die 200 may be different from (e.g., less than) the size of the first die 100. Herein, the term "size" is referred to the length, width and/or area. For example, as shown in the top view of FIG. 1A, the size (e.g., area or footprint) of the second die 200 may be less than the size of the first die 100.

During assembly, the second die 200 may be flipped (e.g., turned upside down) and mounted onto the first die 100. In particular, a second wafer including a plurality of the second dies 200 may be positioned over a first wafer including a plurality of the first dies 100. In other embodiments, the second wafer may be diced to singulate the second dies 200, and the second dies 200 may be individually placed on the first wafer, over respect respective first dies 100.

In some embodiments, the first and second dies 100, 200 may be face-to-face bonded together by bonding the first bonding structure 140 and the second bonding structure 240. The first bonding structure 140 may be aligned with the second bonding structure 240 and then an anneal operation may bond the bonding structures 140, 240 together. In some embodiments, before the second die 200 is bonded to the first die 100, the second bonding structure 240 and the first bonding structure 140 are aligned, such that the second bonding features 244 may be bonded to respective first bonding features 144, and the second bonding layer 242 is bonded to the first bonding layer 142. In some embodiments, the alignment of the first bonding structure 140 and the second bonding structure 240 may be achieved by using an optical sensing method. After the alignment is achieved, the first bonding structure 140 and the second bonding structure 240 may be bonded together by a hybrid bonding process that includes a metal-to-metal bonding and a dielectric-to-dielectric bonding.

In some embodiments, the three-dimensional device structure 10 may include a dielectric encapsulation (DE) layer 50, through-dielectric via (TDV) structures 60, a redistribution layer structure 300, pads 308, and a passivation layer 310, which may be formed after the dicing process. The dielectric encapsulation (DE) layer 50 may be disposed on the first bonding structure 140, surrounding the second die 200. Specifically, the DE layer 50 may surround the sidewalls of the second die 200, expose the top of the second die 200, and overlay the first side (e.g., front side) of the first die 100. In some embodiments, the second side (e.g., back side) of the second die 200 may be substantially co-planar with the top surface of the DE layer 50. In some embodiments, the DE layer 50 includes a molding compound. The molding compound may include a resin and a filler. In alternative embodiments, the DE layer 50 may include silicon oxide, silicon nitride, or a combination thereof. Other suitable dielectric encapsulation materials are within the contemplated scope of disclosure. The DE layer 50 may be formed by spin-coating, lamination, deposition or the like.

In some embodiments, one or more through-substrate via structures 62 may extend through the second semiconductor substrate 202 and electrically contact respective metal features 206 of the second interconnect structure 210.

The TDV structures 60 may be formed through the DE layer 50 and electrically contact the first interconnect structure 110 and the redistribution layer structure 300. In some embodiments, the TDV structures 60 include an electrically conductive material, such as copper, a copper alloy, aluminum, an aluminum alloy, or a combination thereof. In some embodiments, a diffusion barrier layer (not shown) may be disposed around the TDV structures 60, to prevent metal diffusion into the DE layer 50. The diffusion barrier layer may include Ta, TaN, Ti, TiN, CoW, or a combination thereof. Other suitable barrier layer materials may be within the contemplated scope of disclosure.

The redistribution layer structure 300 may be disposed over the second side (e.g., back side) of the second die 200 and over the DE layer 50. The redistribution layer structure 300 may comprise a third dielectric structure 304 having a single-layer or a multi-layer structure. For example, the third dielectric structure 304 may include a first dielectric layer 304A, a second dielectric layer 304B, and a third dielectric layer 304C. The redistribution layer structure 300 may include electrically conductive metal features 306 disposed therein. In some embodiments, the metal features 306 may be electrically connected to the TDV structures 60 and/or to the through-silicon via structures 62. In some embodiments, the redistribution layer structure 300 may include a photosensitive material such as polybenzoxazole (PBO), polyimide (PI), benzocyclobutene (BCB), a combination thereof, or the like. In some embodiments, the metal features 306 may include copper, nickel, titanium, a combination thereof, or the like. Other suitable conductive metal materials may be within the contemplated scope of disclosure to form the metal features 306.

The redistribution layer structure 300 may include a third seal ring 330. The third seal ring 330 may surround the metal features 306. The third seal ring 330 may include materials and structures similar to that of the seal rings 130 and/or 230.

The pads 308 may be disposed over the redistribution layer structure 300. In some embodiments, the pads 308 may be under bump metallization (UBM) pads for mounting conductive connectors, such as metal pillars, micro-bumps or the like. The pads 308 may include a metal or a metal alloy. The pads 308 may include aluminum, copper, nickel, an alloy thereof, or the like, for example. Other suitable pad materials may be within the contemplated scope of disclosure.

The passivation layer 310 may cover the redistribution layer structure 300 and edge portions of the pads 308. Upper surfaces of the pads 308 may be exposed through the passivation layer 310. In some embodiments, the passivation layer 310 includes silicon oxide, silicon nitride, benzocyclobutene (BCB) polymer, polyimide (PI), polybenzoxazole (PBO), a combination thereof, or the like.

In various embodiments, a dicing process may be performed to singulate the three-dimensional device structure 10. For example, a grooving process may be performed to form grooves in a first wafer including the first dies 100 and/or in a second wafer including the second dies 200. In particular, first grooves may be formed that surround the first seal ring 130, second seal ring 230, and/or third seal ring 330. The three-dimensional device structures 10 may be diced along the grooves to complete the dicing process, for example, by mechanical cleavage. In this manner, the sidewalls of first die 100, second die 200 embedded within DE layer 50 and redistribution layer structure 300 may be substantially coincident.

In certain embodiments, the grooving process includes performing one or more laser cutting processes. For example, the laser cutting process may be performed several times with an infrared laser such as an Nd-YAG (neodymium-doped yttrium aluminum garnet) laser. In alternative embodiments, the grooving process may include a mechanical cutting process, an inscribing process, or an etching process.

Embedded Integrated Passive Devices

According to various embodiments, various IPDs may be embedded in the 3D device structure 10, rather than surface-mounted on the 3D device structure 10 or on an underlying PCB. For example, the 3D device structure 10 of FIGS. 1A-1C may include an IPD embedded in the DE layer 50, in order to improve space utilization efficiency. For example, in some embodiments the IPD may be a deep trench capacitor (DTC) 400. However, the present disclosure is not limited to any particular type of IPD. While one DTC 400 is shown in FIGS. 1A-1C, the 3D device structure 10 may include any number of DTCs 400 and/or IPDs, based on the electrical demands and/or device layout of the 3D device structure 10.

In some embodiments, the DTC 400 may be a metal-insulator-metal (MIM) capacitor or a metal-oxide-metal (MOM) capacitor, for example. However, the present disclosure is not limited to any particular type of capacitor. The DTC 400 may have a capacitance density of at least 100 nF/mm$^2$, for example, although greater or lesser capacitance density may be used.

With reference to FIG. 1C, the DTC 400 may include a first conductive layer 402, a second conductive layer 404, and a first dielectric layer 406 disposed there between. In various embodiments, the DTC 400 may include a second dielectric layer 408 disposed on the second conductive layer 404. The conductive layers 402, 404 may include an electrically conductive material, such as copper, a copper alloy, aluminum, an aluminum alloy, tin, gold, silver, tungsten, titanium, a combination thereof, or the like. However, other electrically conductive materials are within the contemplated scope of the present disclosure.

The first and second dielectric layers 406, 408 may be formed of any suitable dielectric material, such as $SiO_2$, SiON, SiN, $Ta_2O$, $Al_2O_3$ or the like. In some embodiments, a diffusion barrier layer (not shown) may be disposed between the first conductive layer 402 and the DE layer 50, to prevent metal diffusion into the DE layer 50. The diffusion barrier layer may include Ta, TaN, Ti, TiN, CoW, or a combination thereof. Other suitable barrier layer and dielectric layer materials are within the scope of the present disclosure.

The DTC 400 may be electrically connected to one or both of the first and second dies 100, 200. The first conductive layer 402 may electrically contact a first bonding feature 144 of the first bonding layer 140. The second conductive layer 404 may electrically contact a metal feature 306 of the redistribution layer structure 300.

In various embodiments, the DTC 400 may include a contact flange 410 comprising end regions of the first conductive layer 402, first dielectric layer 406, and second contact layer 404 that are disposed on the upper surface of the DE layer 50. The contact flange 410 may be configured to provide a larger surface area for connecting the second conductive layer 404 to the corresponding metal feature 306.

Figure 2:
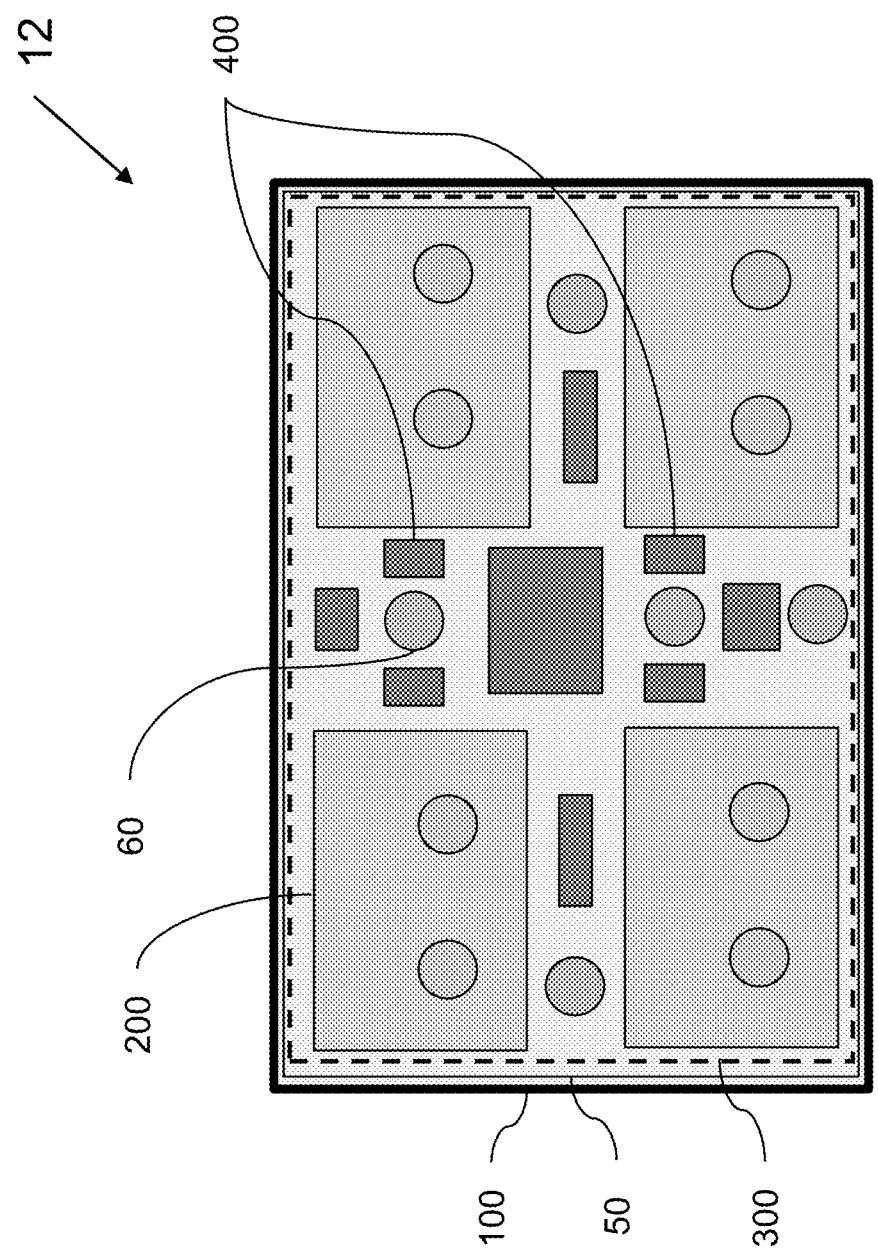
FIG. 2 is a simplified top view of a three-dimensional device structure, according to various embodiments of the present disclosure.

FIG. 2 is a simplified top view of a 3D device structure 12, according to various embodiments of the present disclosure. The 3D device structure 12 may be similar to the 3D device structure 10, so only differences there between will be described in detail.

Referring to FIG. 2, the 3D device structure 12 may include second dies 200 that may be arranged on the upper surface of a first die 100 and may be surrounded by a DE layer 50. A redistribution layer 300 may be disposed on the second dies 200 and the DE layer 50. TDV structures 60 may extend from the upper surface of the first die 100 through the DE layer 50 to contact metal features of the redistribution layer structure 300. The TDV structures 60 may be arranged in gaps between the second dies 200. Various IPDs such as DTCs 400, may be disposed in the DE layer 50, in the gaps or spaces between the each respective second die 200. In some embodiments, the DTCs 400 and/or other IPDs may be disposed between the TDV structures 60 and adjacent one of the second dies 200. Accordingly, IPDs, such as the DTCs 400, may be disposed in the DE layer 50, in the gaps between the second dies 200. As such, the space utilization efficiency of the 3D device structure 12 may be increased.

In various embodiments, the DTC 400 may be formed by etching the DE layer 50 to form a trench exposing one of the first bonding features 144 and optionally a surrounding portion of the first bonding layer 142. The trench may be formed using any suitable etching process, such as wafer-level plasma etching or the like.

Figure 3:
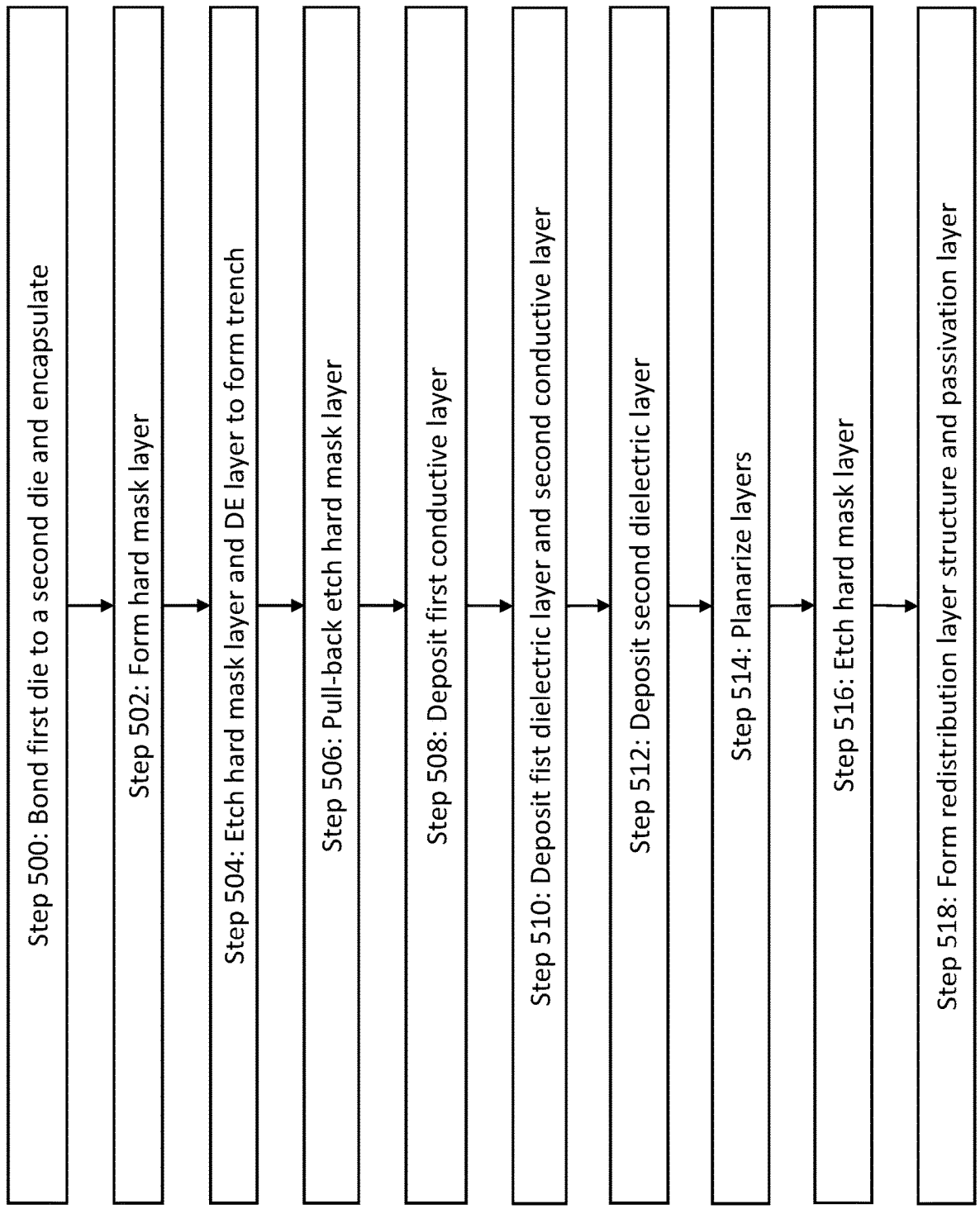
FIG. 3 is a flow chart showing a method of forming the DTC 400 in the 3D device structure 10 of FIGS. 1A-1C, according to various embodiments of the present disclosure.
Figure 4A:
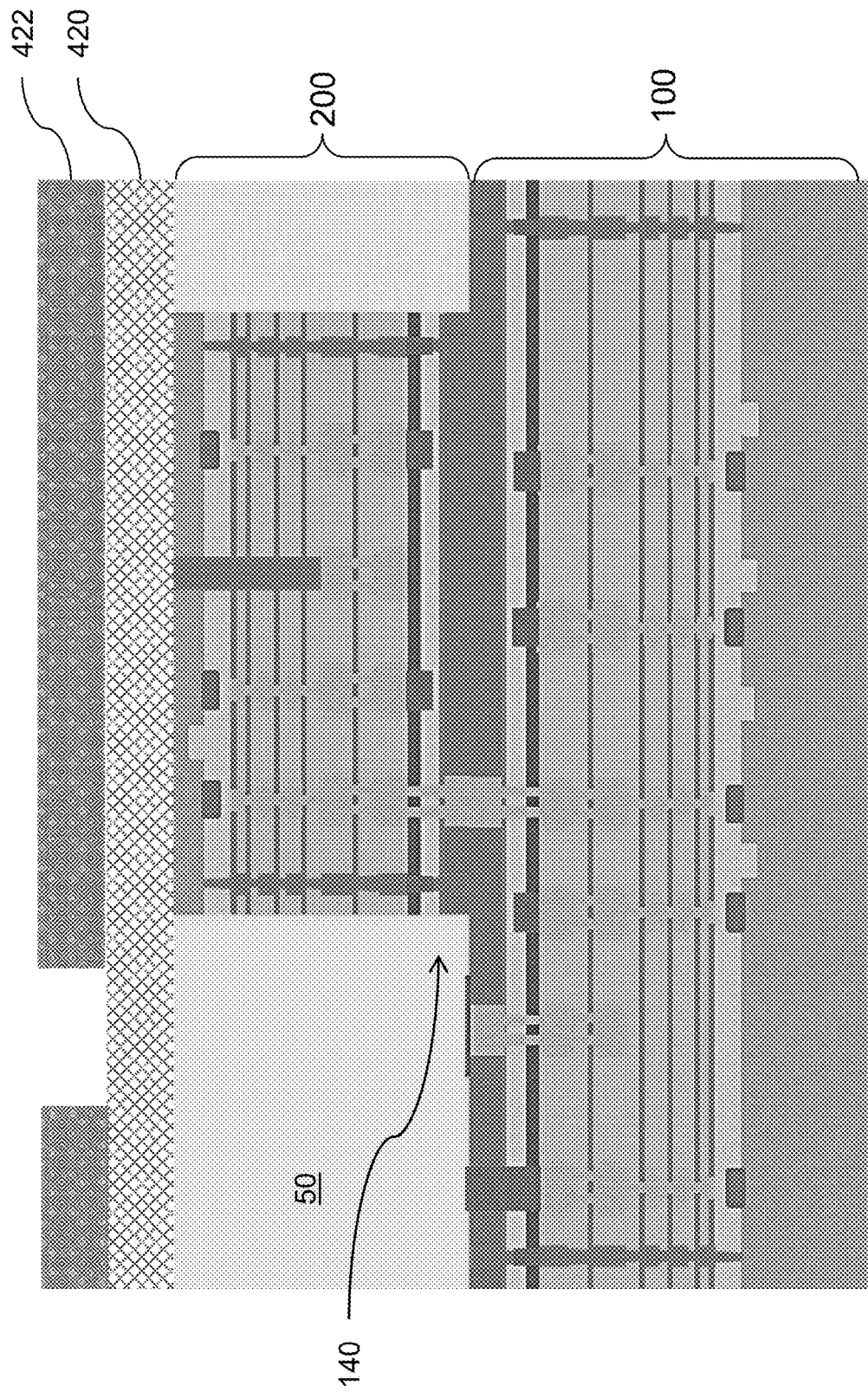

FIG. 3 is a flow chart showing a method of forming the DTC 400 in the 3D device structure 10 of FIGS. 1A-1C, according to various embodiments of the present disclosure. FIGS. 4A-4I are cross-sectional views showing steps of the method of FIG. 3. Referring to FIGS. 3 and 4A, in step 500 the second die 200 may be inverted and bonded to the first die 100 by the first bonding structure 140. The DE layer 50 may be deposited on the upper surface of the first die 100, so as to surround the second die 200.

In step 502, a hard mask layer 420 may be deposited on the second die 200 and the DE layer 50. Examples of a suitable material for the hard mask layer 420 include, but are not limited to, $SiO_2$, $Si_3N_4$, SiON, SiC, SiOC, or any combination thereof.

Figure 4B:
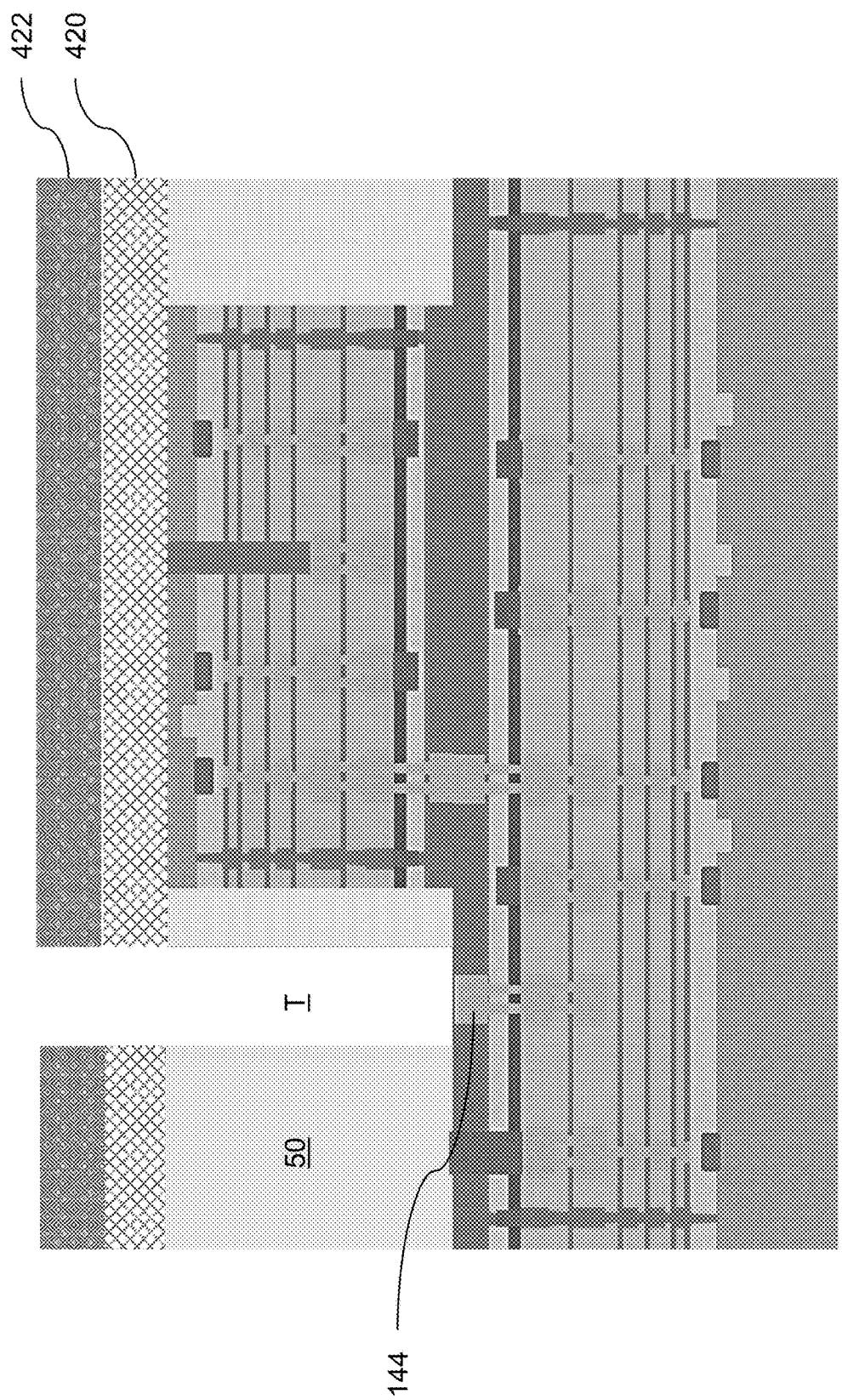

Referring to FIGS. 3 and 4B, in step 504, a photoresist layer 422 may be formed on the hard mask layer 420. The photoresist layer 422 may be patterned under a photo mask, and then etched to expose a portion of hard mask layer 420. The hard mask layer 420 and the DE layer 50 may be etched using one or more etching process, to form a trench T exposing a first bonding feature 144. The etching may include a dry etching method such as plasma (e.g., fluorine containing plasma) etching, a wet etching process, or a combination thereof. The photoresist layer 422 may be stripped off after the etching process.

Figure 4C:
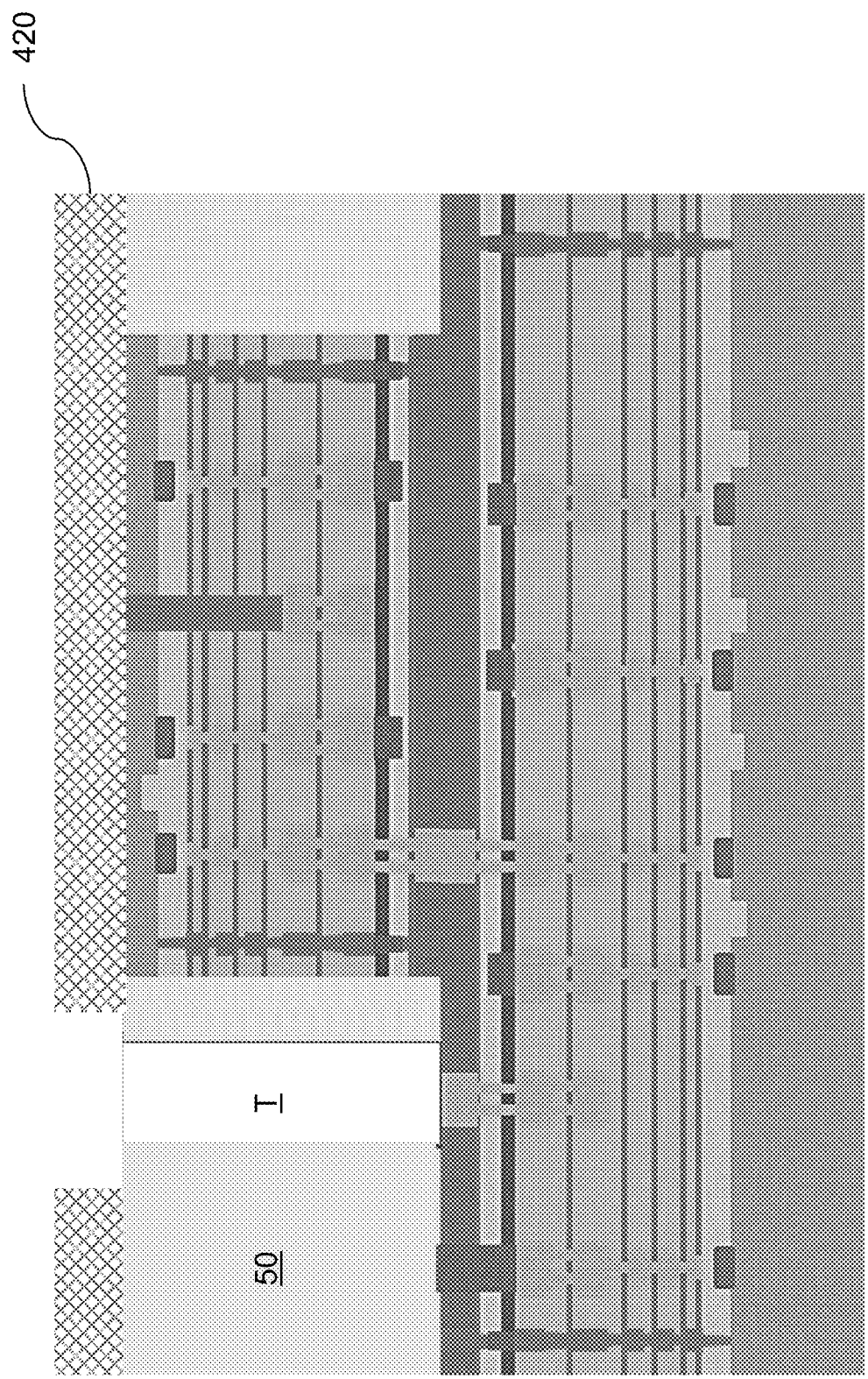

Referring to FIGS. 3 and 4C, in step 506 a pull-back etching process may be performed on hard mask layer 420 to expose a portion of the top surface of the DE layer 50 surrounding the trench T. In some embodiments, the pull-back etching may be performed by applying an acid solution to a portion of the hard mask layer 420

Figure 4D:
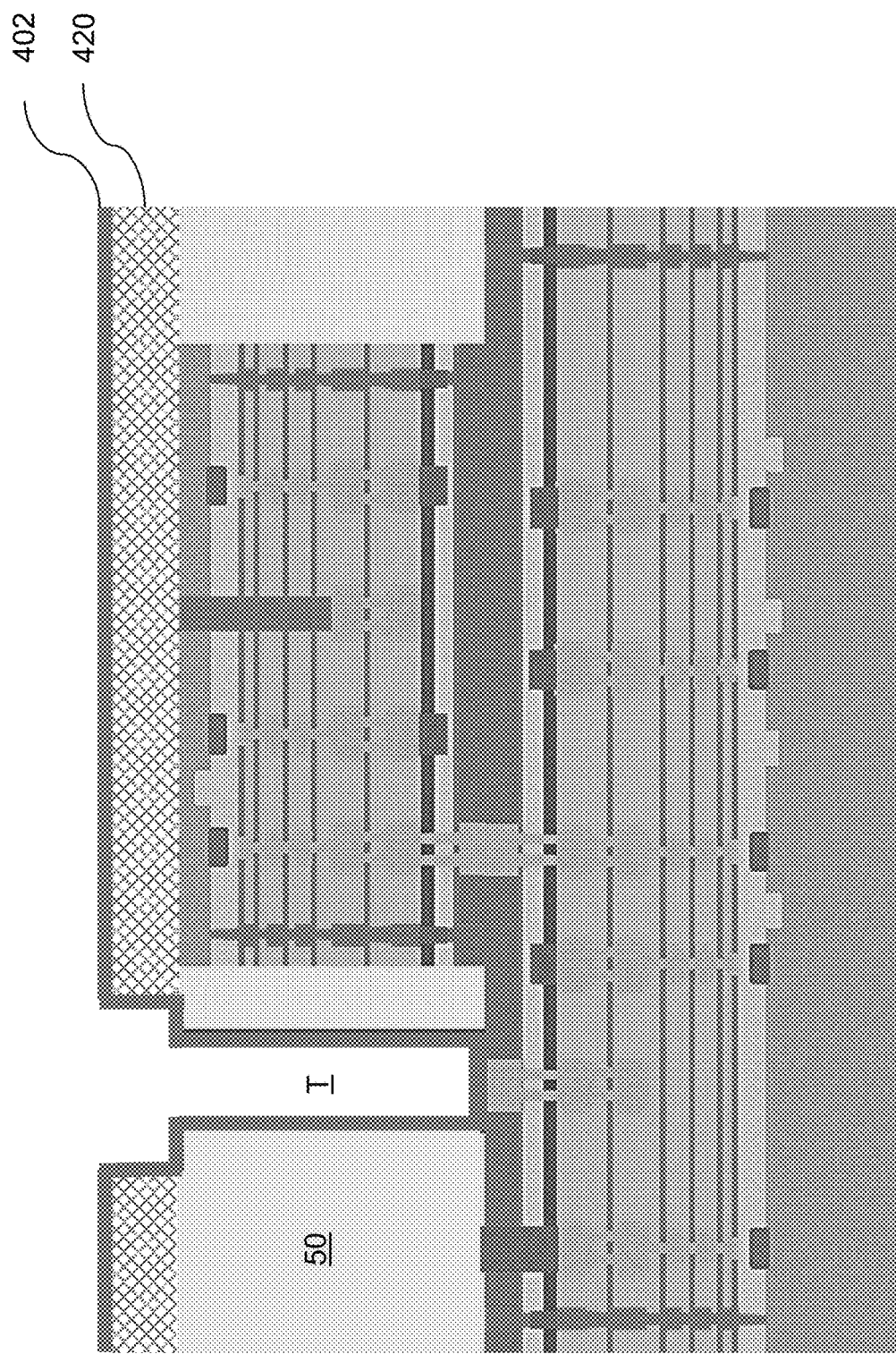

Referring to FIGS. 3 and 4D, in step 508 a first conductive layer 402 may deposited in the trench T and on the hard mask layer 420 using any suitable deposition method, such as using chemical vapor deposition (CVD), high density plasma CVD, sputtering, etc. The first conductive layer 402 may include an electrically conductive material such as for example copper, a copper alloy, aluminum, an aluminum alloy, tin, gold, silver, tungsten, titanium, a combination thereof, or the like.

Figure 4E:
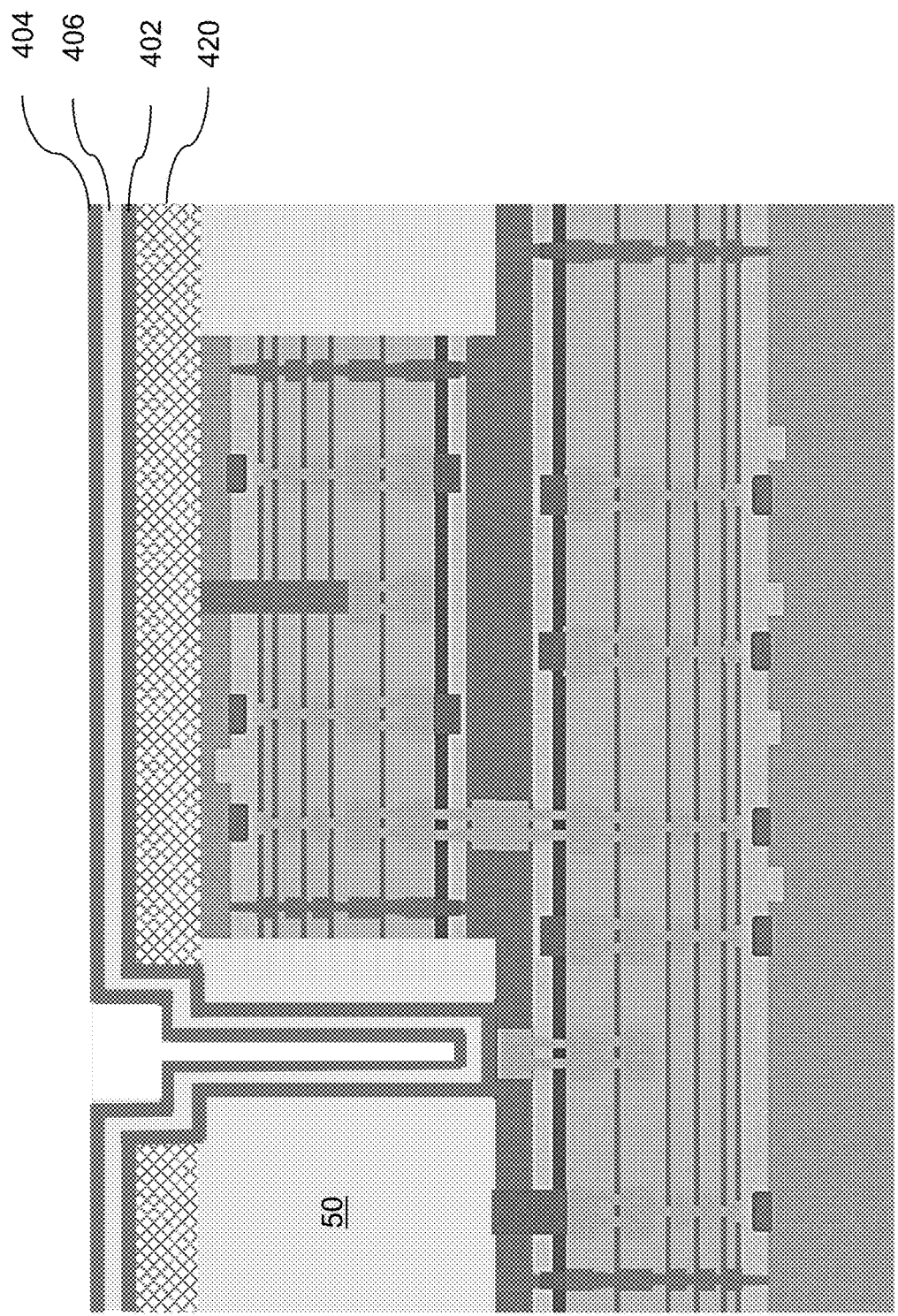

Referring to FIGS. 3 and 4E, in step 510 a first dielectric layer 406 may be deposited on the first conductive layer 402, and second conductive layer 404 may be deposited on the first dielectric layer 406. The first dielectric layer 406 may be formed of any suitable dielectric material, such as $SiO_2$, SiON, SiN, $Ta_2O$, $Al_2O_3$ or the like, and may be formed by using any using any suitable deposition method, such as using chemical vapor deposition (CVD), high density plasma CVD, sputtering, etc. The second conductive layer 404 may be formed using methods and materials as described with respect to the first conductive layer 402.

Figure 4F:
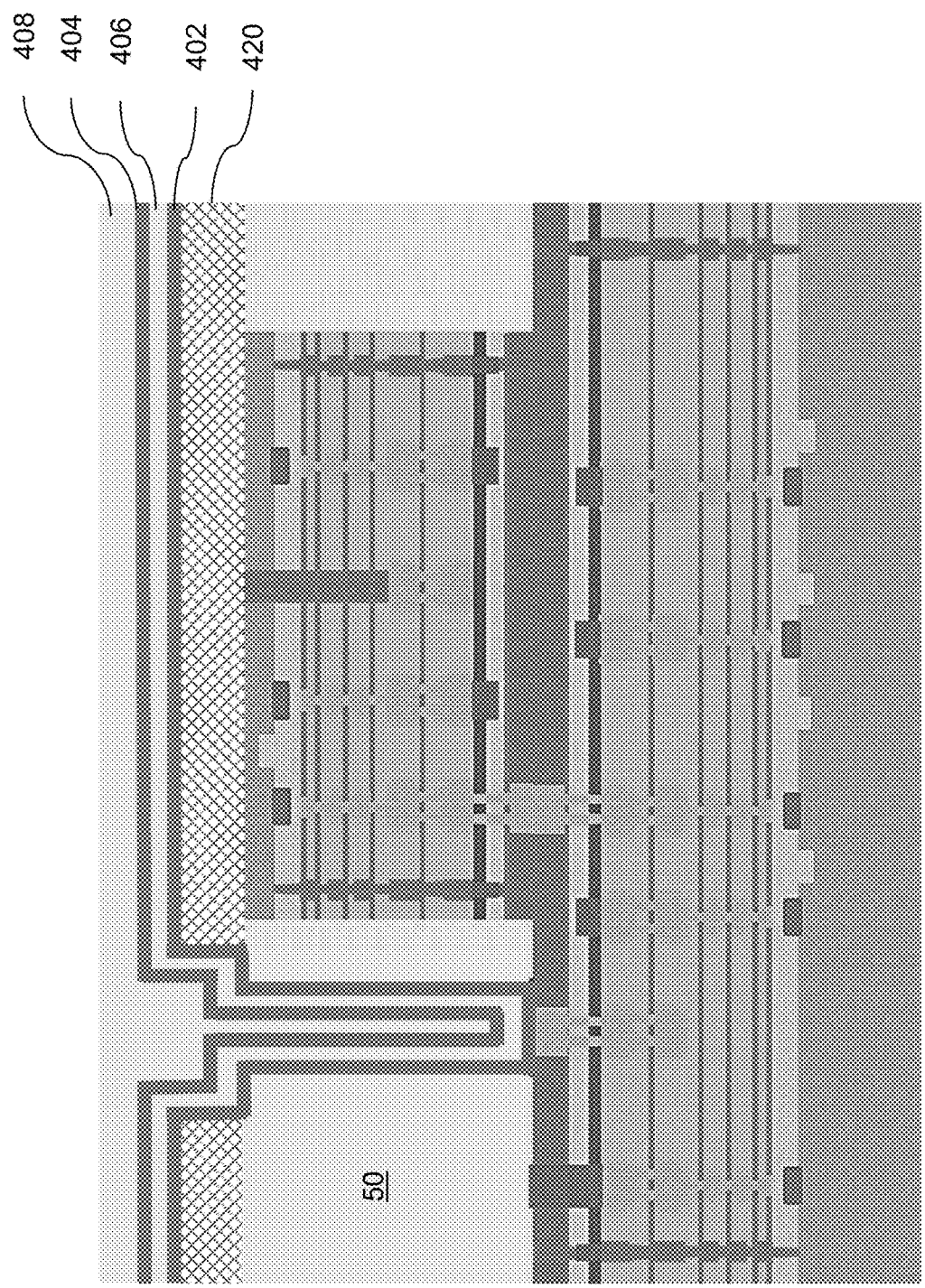

Referring to FIGS. 3 and 4F, in step 512 a second dielectric layer 408 may be formed on the second conductive layer 404. The second dielectric layer 408 may be formed using deposition methods and materials as described with respect to the first dielectric layer 406.

Figure 4G:
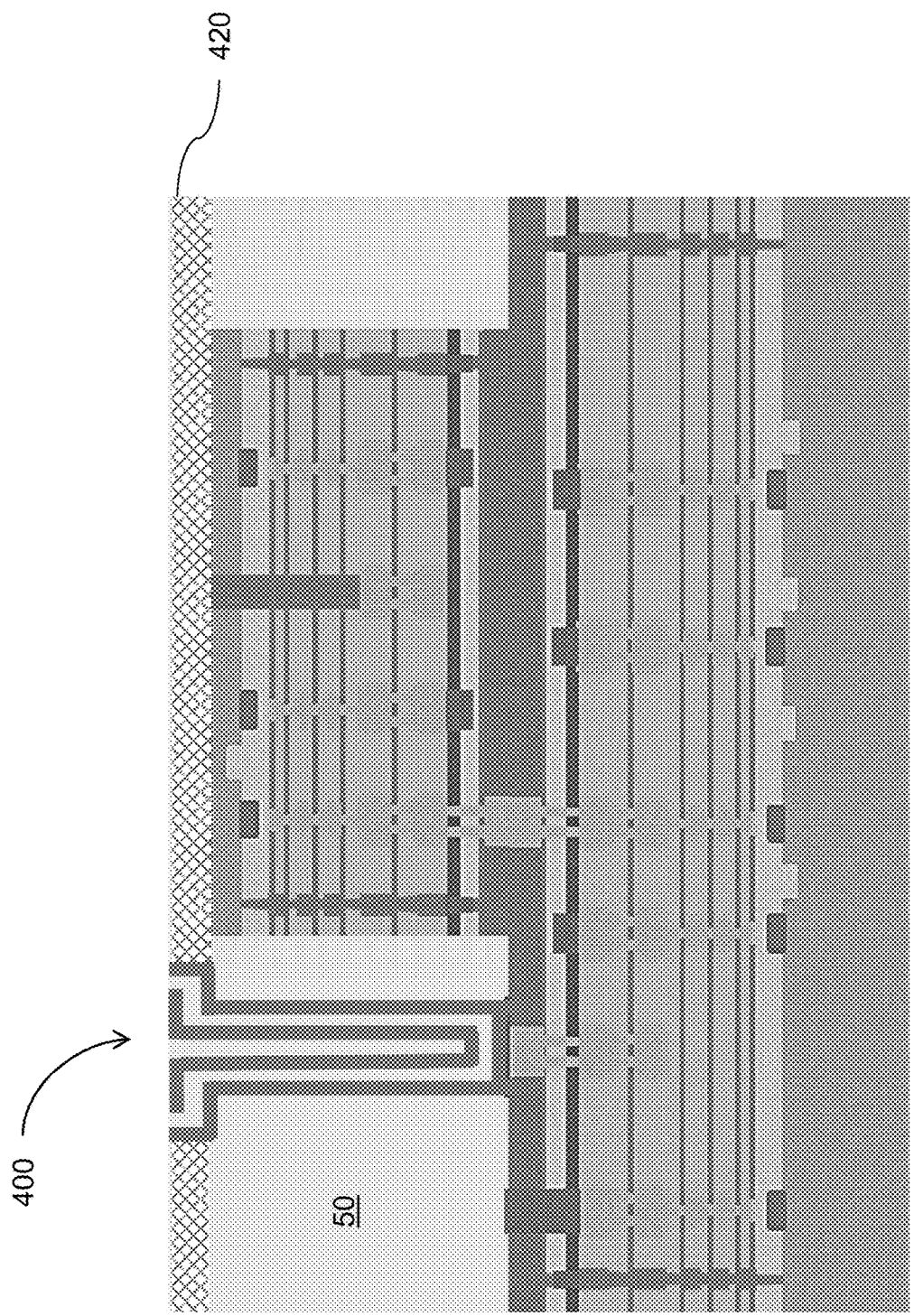

Referring to FIGS. 3 and 4G, in step 514 a planarization process, such as chemical mechanical planarization (CMP), may be performed to reduce the thickness of the hard mask layer 420 and to remove portions of the conductive layers 402, 404 and the dielectric layers 406, 408 that are disposed above the upper surface of the hard mask layer 420, thereby completing the DTC 400.

Referring to FIGS. 3 and 4H, in step 516 the hard mask layer 420 may be etched to expose the second die 200 and the upper surface of the DE layer 50 and the top of the completed DTC 400. Etching the hard mask layer 420 can be performed using a dry etching method such as plasma etching in some embodiments, or a wet etching method such as acid etching in some other embodiments.

Figure 4I:
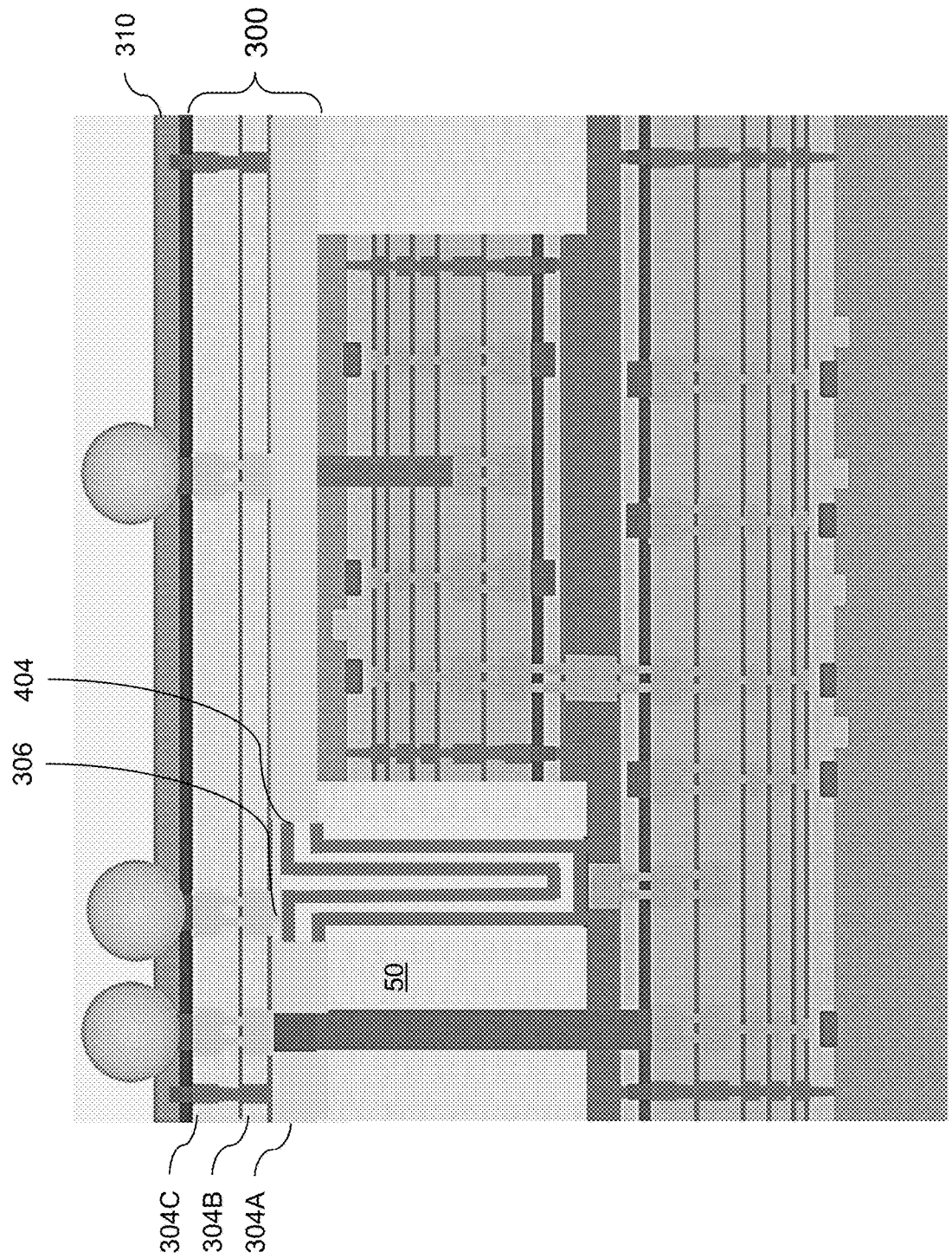

Referring to FIGS. 3 and 4I, in step 518 the redistribution layer structure 300 may be formed on the structure of FIG. 4H, and the passivation layer 310 may be formed on the redistribution layer structure 300. In particular, dielectric layers 304A, 304B, 304C and metal features 306 may be deposited, using any suitable deposition processes, to form the redistribution layer structure 300. The process may be performed such that one of the metal features 306 electrically contacts the second conductive layer 404.

Various embodiments provide a three-dimensional device structure 10 comprising: a first die 100 including a first semiconductor substrate 102; a second die 200 disposed on the first die 100 and including a second semiconductor substrate 202; a dielectric encapsulation (DE) layer 50 disposed on the first die 100 and surrounding the second die 200; a redistribution layer structure 300 disposed on the second die 200 and the DE layer 50; and an integrated passive device (IPD) 400 embedded in the DE layer 50 and electrically connected to the first die 100 and the redistribution layer structure 300.

Various embodiments provide a three-dimensional device structure 12 comprising: a first die 100 comprising a first semiconductor substrate 102; second dies 200 disposed on the first die 100 and comprising respective second semiconductor substrates 202; a dielectric encapsulation (DE) layer 50 disposed on the first die 100 and surrounding the second dies 200; a redistribution layer structure 300 disposed on the plurality second dies 200 and the DE layer 50; through dielectric via (TDV) structures 60 extending from an upper surface of the first die 100 through the DE layer 50 to electrically connect the first die 100 and the redistribution layer structure 300; and an integrated passive devices (IPDs) 400 embedded in the DE layer 50 and electrically connected to the first die 100 and the redistribution layer structure 300, wherein the IPDs 400 are each disposed between one of the TDV structures 60 and an adjacent one of the second dies 200.

Various embodiments provide a method of forming a three-dimensional device structure 10, 12, comprising: bonding a first semiconductor die 100 to a second semiconductor die 200; encapsulating the second semiconductor die 200 in a dielectric encapsulation (DE) layer 50; etching the DE layer 50 to form a trench T exposing at least a portion of the first semiconductor die 100; depositing first conductive layer 402 on the DE layer 50 and in the trench T, so as to electrically contact the first semiconductor die 100; depositing first dielectric layer 406 on the first conductive layer 402; depositing second conductive layer 404 on the first dielectric layer 406; and performing a planarization process to remove portions of the first conductive layer 402, the first dielectric layer 406, and the second conductive layer 404 and form a deep trench capacitor 400.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional device structure comprising:
  a first die comprising a first semiconductor substrate;
  a second die disposed on the first die and comprising a second semiconductor substrate;
  a dielectric encapsulation (DE) layer disposed on the first die and surrounding the second die;
  a redistribution layer structure disposed on the second die and the DE layer; and
  deep trench capacitor (DTC) disposed in a trench formed in the DE layer and electrically connected to the first die and the redistribution layer structure, the DTC comprising:
    a first conductive layer electrically connected to the first die;
    a second conductive layer electrically connected to the redistribution layer structure; and
    a first dielectric layer disposed between the first conductive layer and the second conductive layer.

2. The three-dimensional device structure of claim 1, wherein the DTC comprises a second dielectric layer surrounded by the second conductive layer.

3. The three-dimensional device structure of claim 1, wherein:
  the DTC comprises a contact flange comprising end regions of the first conductive layer, the first dielectric layer, and the second conductive layer that are disposed on an upper surface of the DE layer; and
  the redistribution layer structure comprises a metal feature that electrically contacts the end region of the second conductive layer.

4. The three-dimensional device structure of claim 1, wherein:
  the redistribution layer structure comprises metal features; and
  one of the metal features electrically contacts the second conductive layer.

5. The three-dimensional device structure of claim 1, further comprising a through dielectric via (TDV) structure extending from an upper surface of the first die through the DE layer to electrically connect the first die and the redistribution layer structure.

6. The three-dimensional device structure of claim 5, wherein the DTC is disposed between the TDV structure and the second die.

7. The three-dimensional device structure of claim 1, further comprising multiple DTCs disposed in trenches formed in the DE layer.

8. The three-dimensional device structure of claim 1, wherein:
  the first die further comprises a first interconnect structure disposed on the first semiconductor substrate; and
  the second die further comprises a second interconnect structure disposed on the second semiconductor substrate and electrically connected to the first interconnect structure.

9. A three-dimensional device structure comprising:
  a first die comprising a first semiconductor substrate;
  second dies disposed on and electrically connected to the first die, each of the second dies comprising a respective second semiconductor substrate;
  a dielectric encapsulation (DE) layer disposed on the first die and surrounding the second dies;
  a redistribution layer structure disposed on the second dies and the DE layer;
  through dielectric via (TDV) structures extending from an upper surface of the first die through the DE layer to electrically connect the first die and the redistribution layer structure; and
  deep trench capacitors (DTC) disposed in respective trenches formed in the DE layer and electrically connected to the first die and the redistribution layer structure, wherein the DTCs are each disposed between one of the TDV structures and an adjacent one of the second dies, and each DTC comprises:
    a first conductive layer electrically connected to the first die;
    a second conductive layer electrically connected to the redistribution layer structure; and
    a first dielectric layer disposed between the first conductive layer and the second conductive layer.

10. The three-dimensional device structure of claim 9, wherein each DTC comprises a second dielectric layer surrounded by the second conductive layer.

11. The three-dimensional device structure of claim 9, wherein:
  each DTC comprises a contact flange comprising end regions of the first conductive layer, the first dielectric layer, and the second conductive layer that are disposed on an upper surface of the DE layer; and
  the redistribution layer structure comprises metal features that electrically contact the end regions of the second conductive layers of the DTCs.

12. The three-dimensional device structure of claim 11, wherein the redistribution layer structure comprises metal features embedded in a dielectric layer and electrically contacting the second conductive layers.

13. The three-dimensional device structure of claim 9, wherein:
  the first die further comprises a first interconnect structure disposed on the first semiconductor substrate; and each of the second dies further comprises second interconnect structures disposed on the second semiconductor substrates and electrically connected to the first interconnect structure.

14. A three-dimensional device structure comprising:
a first die comprising a first semiconductor substrate and a first interconnect structure electrically connected to a device layer of the first semiconductor substrate;
a second die disposed on the first die and comprising a second semiconductor substrate;
a dielectric encapsulation (DE) layer disposed on the first die and surrounding the second die;
a redistribution layer structure disposed on the second die and the DE layer;
a deep trench capacitor (DTC) embedded in the DE layer and electrically connected to the first interconnect structure and the redistribution layer structure, the DTC comprising:
a first conductive layer electrically connected to the first die;
a second conductive layer electrically connected to the redistribution layer structure; and
a first dielectric layer disposed between the first conductive layer and the second conductive layer.

15. The three-dimensional device structure of claim 14, further comprising:
a through dielectric via (TDV) structure embedded in the DE layer and electrically connected to the first interconnect structure and the redistribution layer structure.

16. The three-dimensional device structure of claim 15, wherein the DTC is disposed between the TDV structure and the second die.

17. The three-dimensional device structure of claim 14, wherein:
the redistribution layer structure comprises metal features embedded in a dielectric layer; and
one of the metal features electrically contacts the second conductive layer.

18. The three-dimensional device structure of claim 14, wherein:
the DTC comprises a contact flange comprising end regions of the first conductive layer, the first dielectric layer, and the second conductive layer that are disposed on an upper surface of the DE layer; and
the redistribution layer structure comprises a metal feature that electrically contacts the end region of the second conductive layer.

19. The three-dimensional device structure of claim 14, wherein the DTC comprises a second dielectric layer surrounded by the second conductive layer.

20. The three-dimensional device structure of claim 14, further comprising multiple DTCs disposed in trenches formed in the DE layer.

* * * * *